United States Patent
Yang et al.

(10) Patent No.: US 7,816,209 B2
(45) Date of Patent: Oct. 19, 2010

(54) METHOD FOR FABRICATING SEMICONDUCTOR DEVICE

(75) Inventors: Hong-Seon Yang, Ichon-si (KR); Heung-Jae Cho, Ichon-si (KR); Won-Joon Choi, Ichon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 41 days.

(21) Appl. No.: 11/965,734

(22) Filed: Dec. 28, 2007

(65) Prior Publication Data

US 2009/0111254 A1  Apr. 30, 2009

(30) Foreign Application Priority Data

Oct. 24, 2007  (KR) .................... 10-2007-0107357

(51) Int. Cl.
*H01L 21/336* (2006.01)
(52) U.S. Cl. ................ 438/270; 257/E21.429
(58) Field of Classification Search ................ 438/619, 438/259, 270; 257/E21.429
See application file for complete search history.

(56) References Cited

U.S. PATENT DOCUMENTS

| | | | | |
|---|---|---|---|---|
| 7,230,312 | B2 * | 6/2007 | Gonzalez et al. | 257/499 |
| 7,470,588 | B2 * | 12/2008 | Cho et al. | 438/272 |
| 7,563,677 | B2 * | 7/2009 | Yoo et al. | 438/259 |
| 2006/0049455 | A1 * | 3/2006 | Jang et al. | 257/330 |
| 2006/0138474 | A1 * | 6/2006 | Yu et al. | 257/268 |
| 2006/0192249 | A1 * | 8/2006 | Kim et al. | 257/330 |
| 2006/0223249 | A1 * | 10/2006 | Park et al. | 438/197 |
| 2007/0077713 | A1 * | 4/2007 | Ha et al. | 438/270 |
| 2007/0252196 | A1 * | 11/2007 | Kim et al. | 257/329 |

FOREIGN PATENT DOCUMENTS

| KR | 1020050067730 A | 7/2005 |
|---|---|---|
| KR | 1020070017787 A | 2/2007 |
| KR | 1020070030022 A | 3/2007 |
| KR | 1020070056766 A | 6/2007 |

OTHER PUBLICATIONS

Yu et al., "Gate Engineering for Deep-Submicron CMOS Transistors," *IEEE Transactions on Electron Devices* 45:1253-1262 (1998).

* cited by examiner

*Primary Examiner*—W. David Coleman
*Assistant Examiner*—Christine Enad
(74) *Attorney, Agent, or Firm*—Townsend and Townsend and Crew LLP

(57) ABSTRACT

A method for fabricating a semiconductor device includes forming an insulation layer over a substrate including a pattern for forming a multi-plane channel, forming a columnar polysilicon layer over the insulation layer and filling in the pattern, and performing a thermal treatment process.

18 Claims, 10 Drawing Sheets

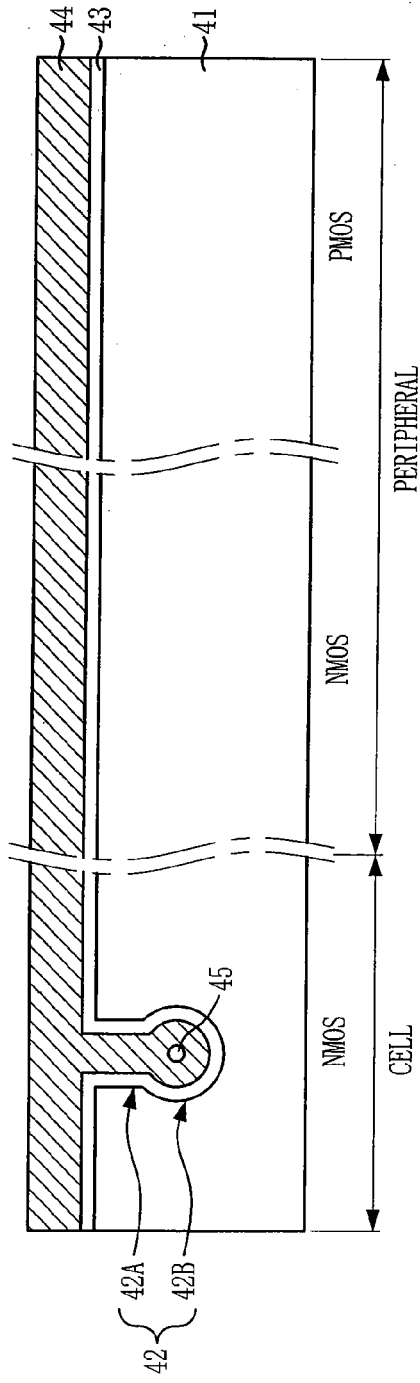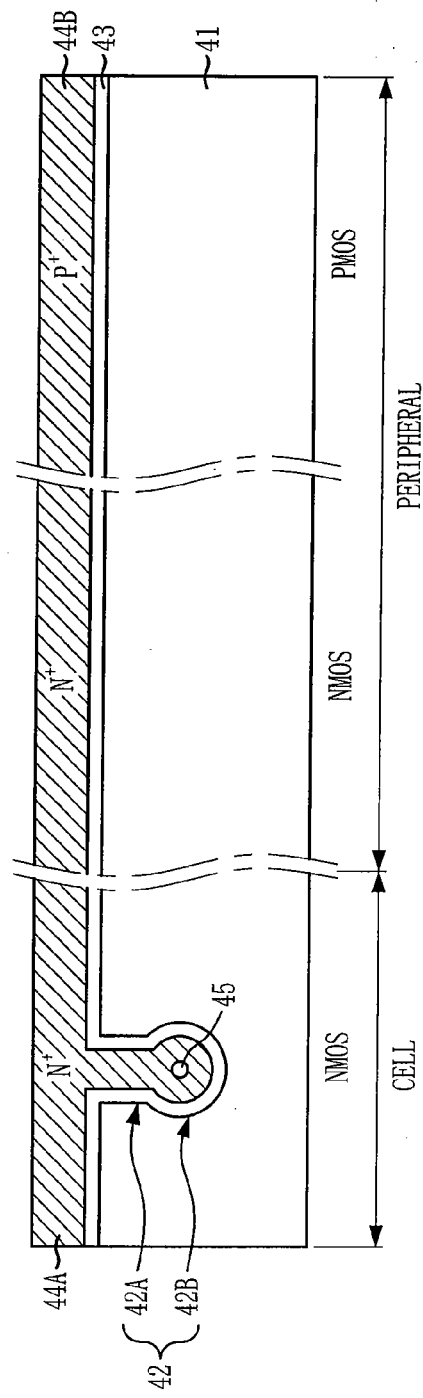

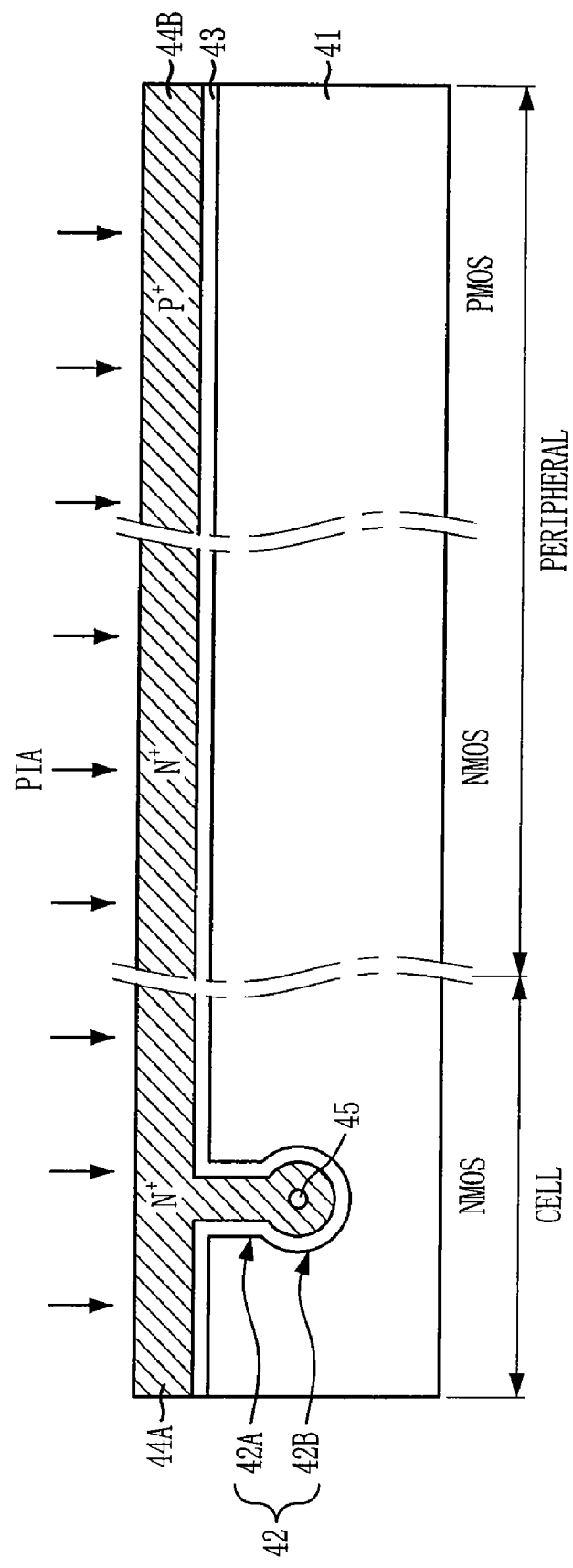

METHOD FOR FABRICATING SEMICONDUCTOR DEVICE

CROSS-REFERENCE TO RELATED APPLICATIONS

The present invention claims priority of Korean patent application number 10-2007-0107357, filed on Oct. 24, 2007, which is incorporated by reference in its entirety.

BACKGROUND OF THE INVENTION

The present invention relates to a method for fabricating a semiconductor device, and more particularly, to a method for fabricating a semiconductor device including a bulb type recess channel.

A method for increasing the length of recess channels has been introduced to obtain improved data retaining time and current characteristics over conventional recess channels. The method includes etching bottom portions of recess channels to form bulb type recess channels. A semiconductor device including such a bulb type recess channel is referred to as a bulb type recess channel array transistor (BRCAT).

FIGS. 1A and 1B illustrate cross-sectional views of a conventional method for fabricating a semiconductor device including a bulb type recess channel.

Referring to FIG. 1A, a bulb type recess pattern 12 is formed in a substrate 11. The bulb type recess pattern 12 includes a first recess 12A and a second recess 12B. The second recess 12B has a rounded shape and the width of the second recess 12B is larger than the width of the first recess 12A.

An insulation layer 13 is formed over the bulb type recess pattern 12. An amorphous silicon layer 14 is then formed over the insulation layer 13 and fills in a space provided by the bulb type recess pattern 12. Although not shown, the amorphous silicon layer 14 is doped with impurities.

Referring to FIG. 1B, a thermal treatment process is performed on the amorphous silicon layer 14. Thus, the amorphous silicon layer 14 is transformed to a polysilicon layer 14A.

According to the conventional method, the polysilicon layer 14A is formed by forming the amorphous silicon layer 14, doping impurities in the amorphous silicon layer 14, and performing the thermal treatment process for activating the impurities to transform the amorphous silicon layer 14 to the polysilicon layer 14A. The thermal treatment process is referred to as a post implantation anneal (PIA) process.

However, it is difficult to avoid generation of a seam 15 in the second recess 12B while forming the amorphous silicon layer 14. The seam 15 may grow and move during the subsequent thermal treatment process. That is, for the amorphous silicon layer 14 having a minute seam, e.g., a micro void, the seam 15 may grow and move while the amorphous silicon layer 14 changes into the polysilicon layer 14A due to changes of volume and stress.

The seam 15 may move and create an empty space on the insulation layer 13. Thus, a region where the insulation layer 13 and the polysilicon layer 14A are not in contact is formed. The region is represented by reference numeral 15A. Generation of such regions may result in a decreased effective channel surface area, causing a decreased current flow. Also, a write recovery time (tWR) failure may result.

Another fabrication method using a multi-step process has been introduced to reduce growth and movement of seams. FIG. 1C illustrates a conventional method for forming a polysilicon layer using a multi-step process.

According to the multi-step process, a bulb type recess region 12' is formed in a substrate 11'. The bulb type recess region 12' includes a first recess 12A' and a second recess 12B'. An insulation layer 13' is formed over the bulb type recess region 12' and the substrate 11'. A first amorphous silicon layer 14A' is formed. A first thermal treatment process and a cleaning process are performed. A second amorphous silicon layer 14B is formed over the resultant structure.

The first amorphous silicon layer 14A' changes to a polysilicon layer by the first thermal treatment process when performing the multi-step process. Thus, the first amorphous silicon layer 14A' is unlikely to change during a subsequent high-temperature thermal treatment process performed after the second amorphous silicon layer 14B is formed. As a result, movement of a seam 16 may be controlled while forming the second amorphous silicon layer 14B.

Although the multi-step process may prevent seams from moving, the process is complicated. Thus, fabrication time increases, resulting in increased costs. Therefore, a simplified process may be required.

Furthermore, the conventional methods use a polysilicon layer obtained by performing a thermal treatment process on a amorphous silicon layer as a gate electrode. Thus, severe sidewall damage may occur on the polysilicon layer, or an etch profile of a gate may become uneven during a gate etch process.

SUMMARY OF THE INVENTION

Embodiments of the present invention provide a method for fabricating a semiconductor device including a bulb type recess channel using a simplified method which can reduce movement of a seam in a polysilicon layer used as a gate electrode.

Embodiments of the present invention also provide a method for fabricating a semiconductor device with a uniform gate etch profile distribution.

In accordance with an aspect of the present invention, a method for fabricating a semiconductor device includes forming an insulation layer over a substrate including a pattern for forming a multi-plane channel, forming a columnar polysilicon layer over the insulation layer and filling in the pattern, and performing a thermal treatment process.

In accordance with another aspect of the present invention, a method for fabricating a semiconductor device includes forming a pattern for forming a multi-plane channel in a cell region of a substrate, wherein the substrate includes the cell region in which an N-channel metal-oxide semiconductor (NMOS) is to be formed and a peripheral region in which an NMOS and a P-channel metal-oxide semiconductor (PMOS) are to be formed at substantially the same time; forming an insulation layer over the substrate structure; forming a columnar polysilicon layer over the insulation layer and filling in the pattern; implanting N-type impurities in portions of the columnar polysilicon layer where the NMOS is to be formed; implanting P-type impurities in a portion of the columnar polysilicon layer where the PMOS is to be formed; and performing a thermal treatment process.

BRIEF DESCRIPTION OF THE DRAWINGS

FIGS. 4A to 4E illustrate cross-sectional views of a method for fabricating a semiconductor device including a bulb type recess channel in accordance with a second embodiment of the present invention.

DESCRIPTION OF SPECIFIC EMBODIMENTS

Embodiments of the present invention relate to a method for fabricating a semiconductor device with a columnar polysilicon gate.

In accordance with embodiments of the present invention, a polysilicon layer used as a gate electrode material filled in a bulb type recess region is formed in a columnar structure during an initial formation process. Thus, seam movement and growth may be reduced during a subsequent post implantation anneal (PIA) process.

In accordance with other embodiments of the present invention, the process is simplified because a bulb type recess region is filled using a single formation process.

In accordance with other embodiments of the present invention, using a columnar polysilicon layer reduces grain size changes during a subsequent PIA process and maintains a crystal structure of the initial formation to maintain a uniform gate etch profile distribution.

In accordance with other embodiments of the present invention, a columnar polysilicon layer's grain boundary is smaller than that of a polysilicon layer grown by performing a PIA process on an amorphous silicon layer. Thus, a polysilicon depletion event may be reduced.

In the following embodiments, forming a polysilicon layer in a bulb type recess region is performed in a single step. The polysilicon layer is initially formed in a columnar structure, instead of forming a polysilicon layer by forming an amorphous silicon layer and performing a thermal treatment process.

FIGS. 2A to 2D illustrate cross-sectional views of a method for fabricating a semiconductor device including a bulb type recess channel in accordance with a first embodiment of the present invention.

Figure 1A:
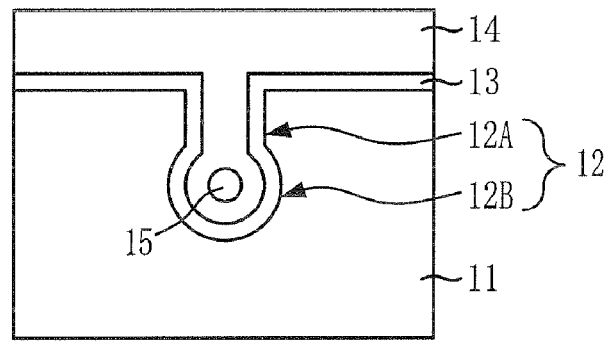
FIGS. 1A and 1B illustrate cross-sectional views of a conventional method for forming a semiconductor device including a bulb type recess channel.
Figure 1B:
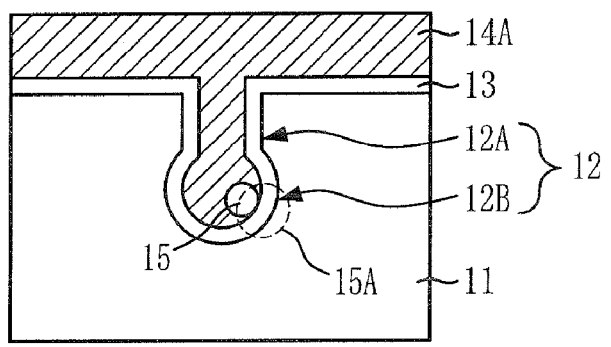
Figure 1C:
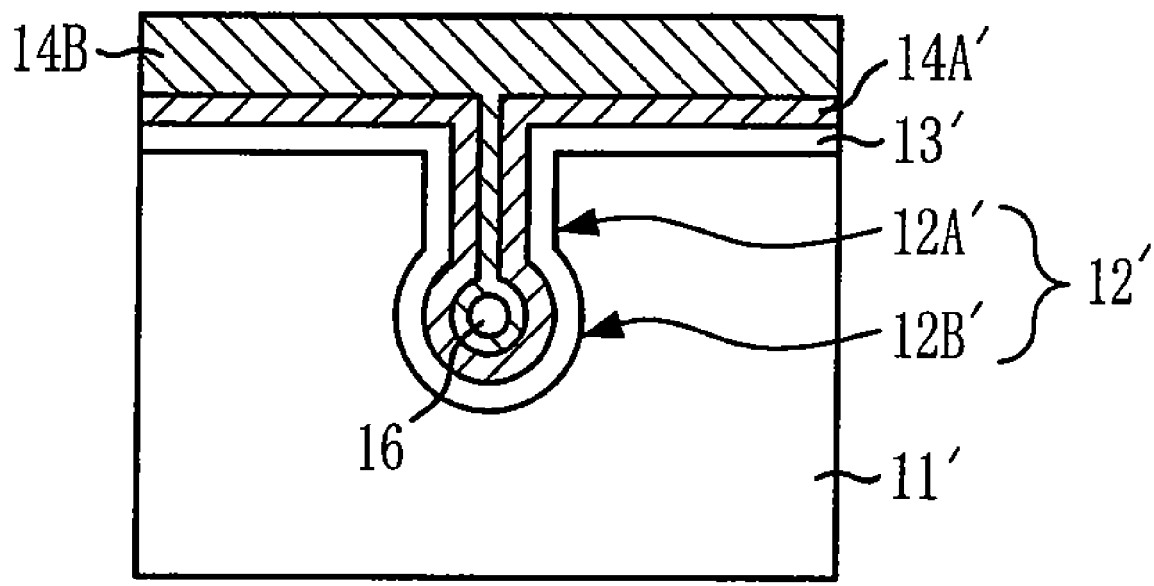
FIG. 1C illustrates a cross-sectional view of a conventional method for forming a polysilicon layer using a multi-step process.
Figure 2A:
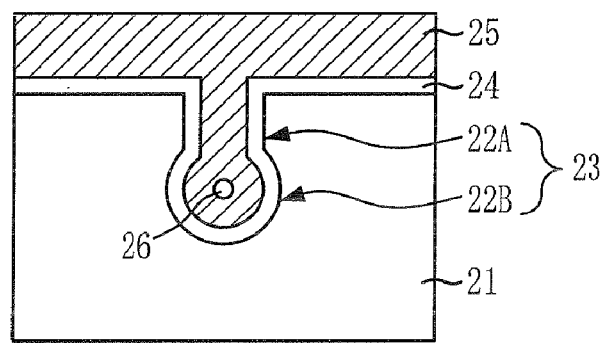
FIGS. 2A to 2D illustrate cross-sectional views of a method for fabricating a semiconductor device including a bulb type recess channel in accordance with a first embodiment of the present invention.

Referring to FIG. 2A, a bulb type recess region 23 is formed in a substrate 21. The bulb type recess region 23 includes a first recess 22A and a second recess 22B. The second recess 22B has a larger width than the first recess 22A, and has a rounded shape.

An insulation layer 24 is formed over the substrate 21 and the bulb type recess region 23. The insulation layer 24 may include silicon dioxide ($SiO_2$), silicon oxynitride (SiON), silicon nitride ($Si_3N_4$), hafnium (Hf) silicate, hafnium silicon oxynitride, or a combination thereof. The SiON may be formed by performing a plasma oxidation process after forming a silicon oxide layer.

A polysilicon layer 25 is formed over the substrate structure and fills in the bulb type recess region 23. The polysilicon layer 25 has a columnar crystal structure. For instance, the polysilicon layer 25 is formed in a single wafer type chamber or a furnace using a chemical vapor deposition (CVD) method.

The polysilicon layer 25 is formed at a temperature ranging from approximately 650° C. to approximately 800° C. Forming the polysilicon layer 25 includes implanting silane ($SiH_4$), phosphine ($PH_3$), and hydrogen ($H_2$). The $SiH_4$ is implanted at a flow rate of approximately 50 sccm, the $PH_3$ is implanted at a flow rate ranging from approximately 280 sccm to approximately 600 sccm, and the $H_2$ is implanted at a flow rate of approximately 2,000 sccm. The polysilicon layer 25 is formed using a pressure ranging from approximately 10 mTorr to approximately 500 mTorr. For instance, a pressure of approximately 50 mTorr is used.

A formation time of the polysilicon layer 25 is approximately 100 seconds or less. For instance, a formation time of the polysilicon layer 25 ranges from approximately 10 seconds to approximately 100 seconds.

The polysilicon layer 25 is formed to a thickness ranging from approximately 500 Å to approximately 1,000 Å. Using the $PH_3$ gas as a doping gas allows in-situ doping of phosphorus (P) in the polysilicon layer 25 at a concentration level ranging from approximately $1 \times 10^{20}$ atoms/cm$^3$ to approximately $1 \times 10^{21}$ atoms/cm$^3$.

The polysilicon layer 25 is formed to fill the bulb type recess region 23 in a single step. Thus, the first recess 22A is sufficiently filled with the polysilicon layer 25.

A seam 26 may be formed in the polysilicon layer 25 in the second recess 22B having a larger width than the first recess 22A. However, the seam 26 is unlikely to grow or move during a subsequent thermal treatment process because the polysilicon layer 25 is formed in a columnar structure. The subsequent thermal treatment process refers to a thermal treatment process performed for impurity activation. This result is obtained because the columnar polysilicon layer 25 experiences less grain size changes during a subsequent thermal treatment process.

The columnar polysilicon layer 25 is deposited as a polysilicon layer, and is a structurally stabilized polysilicon layer where grain size changes are less likely to occur by a subsequent thermal treatment process. In addition, the columnar polysilicon layer 25 has an improved step coverage characteristic compared to an amorphous silicon layer. Thus, the columnar polysilicon layer 25 has fewer sites generating fine seams. Furthermore, seams generated when forming the columnar polysilicon layer 25 are smaller in size than those generated when forming an amorphous silicon layer.

Figure 2B:
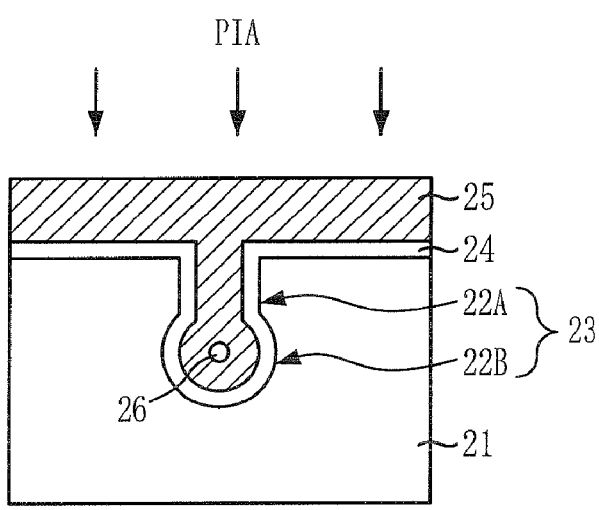

Referring to FIG. 2B, a thermal treatment process is performed to activate phosphorus implanted as impurities in the polysilicon layer 25. The thermal treatment process is referred to as a post implantation anneal (PIA) process. The PIA process is performed at a temperature ranging from approximately 600° C. to approximately 1,000° C. for approximately 10 seconds to approximately 60 seconds.

Impurities like phosphorus may be additionally implanted in the polysilicon layer 25 before performing the thermal treatment process. A plasma doping method is used rather than an ion implantation method so that uniform impurity distribution may be obtained in the polysilicon layer 25 formed in the bulb type recess region 23.

As described above, the seam 26 in the polysilicon layer 25 may not grow or move even if the PIA process is performed. This is because the polysilicon layer 25 is initially formed to have a columnar structure. Unlike an amorphous silicon layer, the columnar polysilicon layer 25 may not experience grain size changes during the PIA process. Consequently, a crystal state of the polysilicon layer 25 during the initial formation is maintained, and thus, the seam 26 may not grow or move.

When an amorphous silicon layer changes into a polysilicon layer after a PIA process, the grain size increases up to a level of approximately 800 Å. However, a columnar polysilicon layer has the grain size ranging from approximately 200 Å to approximately 300 Å even after a PIA process is performed. The grain size of the columnar polysilicon layer is much smaller that that of the amorphous silicon layer. The number of grain boundaries of the columnar polysilicon layer is further increased to be more than that of the amorphous silicon layer after the PIA process is performed.

Because there is virtually no grain size change in the columnar polysilicon layer, using the columnar polysilicon layer may obtain an increased in the number of grain boundaries which accelerates impurity diffusion. Thus, an additional benefit may be obtained where a polysilicon depletion event is reduced on an interface between an insulation layer and the polysilicon layer. Accordingly, an activation current of the semiconductor device may increase.

On the other hand, when a PIA process is performed on an amorphous silicon layer, the grain size usually increases or a grain boundary generally decreases. These events cause a polysilicon depletion event where impurities diffusing onto an interface between the polysilicon layer and an insulation layer decrease.

Figure 2C:
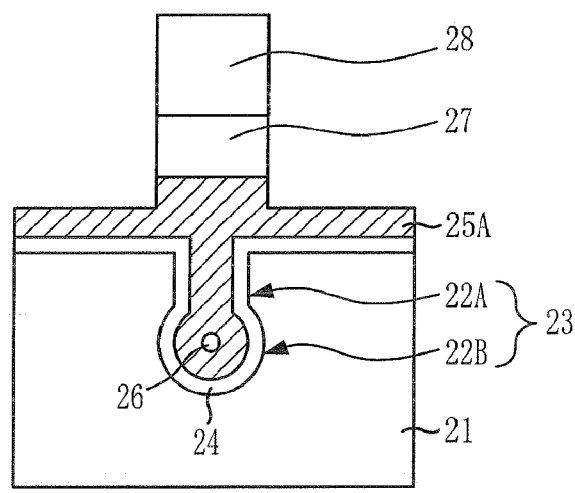

Referring to FIG. 2C, a metal-based electrode layer 27 and a hard mask 28 are formed over a patterned polysilicon layer 25A. In more detail, a metal-based layer is formed over the polysilicon layer 25. For instance, the metal-based layer includes a tungsten nitride layer and a tungsten layer. The tungsten nitride layer functions as a diffusion barrier layer.

A hard mask layer is formed over the metal-based layer. The hard mask layer includes a nitride-based layer. For instance, the hard mask layer includes a silicon nitride layer.

A first gate etch is performed. The first gate etch includes etching the hard mask layer and the metal-based layer and etching a portion of the polysilicon layer 25. Thus, the hard mask 28, the metal-based electrode layer 27, and the patterned polysilicon layer 25A are formed.

Figure 2D:
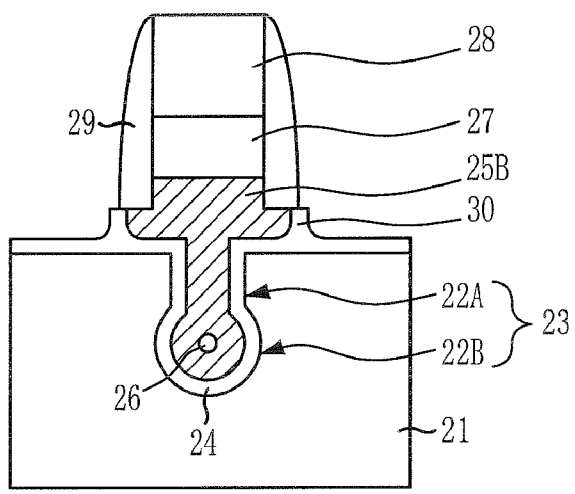

Referring to FIG. 2D, a capping layer is formed over the resultant structure and an etch-back process is performed. The patterned polysilicon layer 25A is etched to form a gate stack. Reference numeral 25B represents a remaining polysilicon layer.

Portions of the capping layer remain on upper portions of the remaining polysilicon layer 25B and sidewalls of the metal-based electrode layer 27 and the hard mask 28. Reference numeral 29 represents remaining capping layers.

A selective oxidation process is performed as a subsequent process to form oxide-based layers 30. The selective oxidation process is performed in ambient hydrogen. Thus, exposed sidewalls of the remaining polysilicon layer 25B are selectively oxidized and the sidewalls of the metal-based electrode layer 27 are protected from oxidation by the remaining capping layers 29.

The selective oxidation process is performed to form the oxide-based layers 30 including "bird's beaks" at the bottom corners of the gate stack. The bird's beaks reduce electric field concentration at the corners of the gate stack.

Figure 3A:
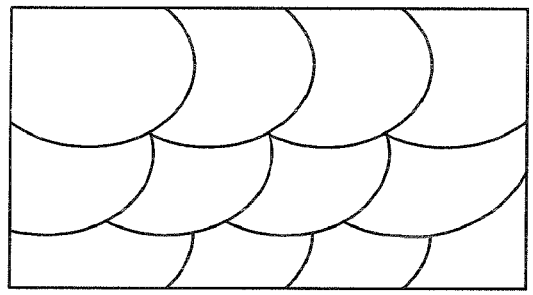
FIG. 3A illustrates a diagram of grains of a polysilicon layer obtained by performing a thermal treatment process on an amorphous silicon layer.
Figure 3B:
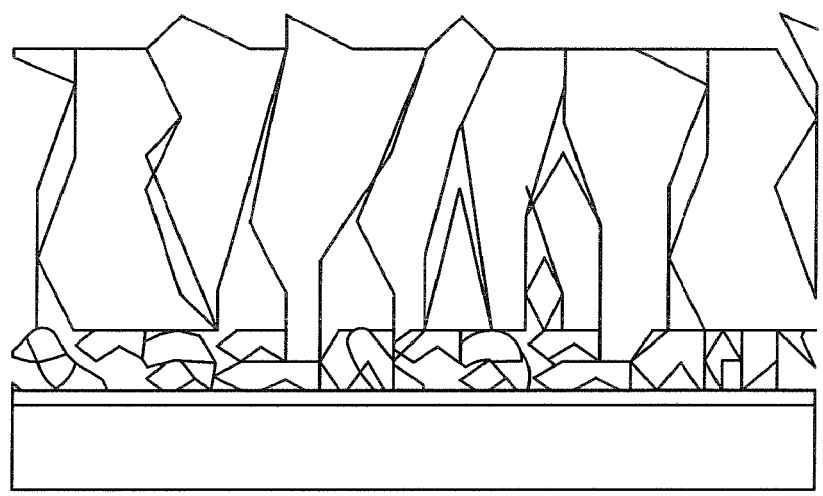
FIG. 3B illustrates a diagram of grains of a columnar polysilicon layer.

FIG. 3A illustrates a diagram of grains of a polysilicon layer obtained by performing a thermal treatment process on an amorphous silicon layer. FIG. 3B illustrates a diagram of grains of a columnar polysilicon layer. The columnar polysilicon layer refers to a polysilicon layer formed at a temperature ranging from approximately 650° C. to approximately 800° C.

An amorphous silicon layer lacks the regularities of silicon atom arrangement and has a structure where grains and a grain boundary do not exist. A single crystal silicon layer is a silicon layer composed of one grain with a regular atom arrangement. Polysilicon represents a silicon layer composed of a plurality of grains.

A crystal structure of polysilicon may obtain a columnar structure depending on the shape of the grain. The columnar structure may be obtained at a temperature ranging from approximately 650° C. to approximately 800° C.

FIGS. 4A to 4E illustrate cross-sectional views of a method for fabricating a semiconductor device including a bulb type recess channel in accordance with a second embodiment of the present invention.

Referring to FIG. 4A, a substrate 41 is defined in a cell region and a peripheral region. The cell region is where an N-channel metal-oxide semiconductor (NMOS) will be formed, and the peripheral region is where an NMOS and a P-channel metal-oxide semiconductor (PMOS) will be formed at substantially the same time.

A bulb type recess region 42 is formed in the cell region of the substrate 41. The bulb type recess region 42 includes a first recess 42A and a second recess 42B. The second recess 42B has a larger width than the first recess 42A and has a rounded shape.

The cell region may be a region where an NMOS having a bulb type recess channel is to be formed. The peripheral region may be a region where an NMOS and a PMOS having a planar channel are to be formed.

An insulation layer 43 is formed over the substrate 41 and the bulb type recess region 42. For instance, the insulation layer 43 includes a silicon dioxide ($SiO_2$) layer. The insulation layer 43 may have a dual gate oxide structure. The dual gate oxide structure refers to different thicknesses in the cell region and the peripheral region.

The thickness of the insulation layer 43 in the cell region may be smaller than the thickness of the insulation layer 43 in the peripheral region. For instance, the insulation layer 43 is formed to a thickness ranging from approximately 20 Å to approximately 30 Å in the cell region and to a thickness ranging from approximately 40 Å to approximately 60 Å in the peripheral region.

A plasma nitridation process is performed to nitridize the insulation layer 43. For instance, if the insulation layer 43 includes a silicon oxide layer, the silicon oxide layer transforms into a silicon oxynitride layer through the plasma nitridation process.

A polysilicon layer 44 is formed over the insulation layer 43 and fills in the bulb type recess region 42. The polysilicon layer 44 has a columnar crystal structure.

For instance, forming the polysilicon layer 44 includes forming a polysilicon layer crystallized in a columnar structure in a single wafer type chamber or a furnace. The polysilicon layer 44 is formed at a temperature ranging from approximately 650° C. to approximately 800° C.

Forming the polysilicon layer 44 includes using silane ($SiH_4$) as a source gas and may include selectively adding hydrogen ($H_2$). The $SiH_4$ flows at a rate of approximately 50 sccm, and the $H_2$ flows at a rate of approximately 2,000 sccm.

The polysilicon layer 44 is formed at a pressure ranging from approximately 10 mTorr to approximately 500 mTorr. For instance, the polysilicon layer 44 is formed at a pressure of approximately 50 mTorr. The polysilicon layer 44 is formed to a thickness ranging from approximately 500 Å to approximately 1,000 Å for a formation time of approximately 100 seconds or less. For instance, a formation time of the polysilicon layer 44 ranges from approximately 10 seconds to approximately 100 seconds.

Phosphine ($PH_3$) gas may be further added as an impurity doping gas. The $PH_3$ gas flows at a rate ranging from approximately 280 sccm to approximately 600 sccm. Using the $PH_3$ gas allows in-situ doping of phosphorus (P) in the polysilicon layer 44 at a concentration level ranging from approximately $1\times10^{20}$ atoms/cm$^3$ to approximately $1\times10^{21}$ atoms/cm$^3$.

The polysilicon layer 44 is formed to fill the bulb type recess region 42 in a single step. Thus, the first recess 42A is sufficiently filled with the polysilicon layer 44.

A minute sized seam 45 may be formed in the polysilicon layer 44 in the second recess 42B which has a larger width than the first recess 42A. Seams generated while forming the columnar polysilicon layer 44, e.g., the seam 45, is much smaller than a seam generated while forming an amorphous silicon layer. The polysilicon layer 44 having a columnar structure has an improved step coverage characteristic compared to an amorphous silicon layer and thus has less sites generating minute seams such as the seam 45.

Although it will be described in detail later, the seam 45 in the polysilicon layer 44 is unlikely to move during a subsequent thermal treatment process because the polysilicon layer 44 is formed with a columnar structure. The subsequent thermal treatment process refers to a thermal treatment process performed for impurity activation.

This result is obtained because the columnar polysilicon layer 44 experiences less grain size changes during a subsequent thermal treatment process. The columnar polysilicon layer 44 is deposited as a polysilicon layer, and is a structurally stabilized polysilicon layer where grain size changes are less likely to occur by a subsequent thermal treatment process.

Referring to FIG. 4B, impurity ion implantation processes for forming N-type impurity doped polysilicon (NPG) and P-type impurity doped polysilicon (PPG) are performed on the polysilicon layer 44. The ion implantation processes may each be performed using a photoresist layer as an ion implantation mask, where the photoresist layer is formed using a photo mask process. The processes for forming the NPG and the PPG are performed to form a dual poly gate structure.

For instance, N-type impurities are implanted to form the NPG may include phosphorus (P) and P-type impurities are implanted to form the PPG may include boron (B). Implanting boron in the polysilicon layer 44 doped with phosphorus causes the polysilicon layer 44 to transform into a P-type polysilicon layer doped with boron by counter doping.

Consequently, portions of the polysilicon layer 44 for forming gate electrodes of NMOS change into N-type ($N^+$) polysilicon layers 44A and a portion of the polysilicon layer 44 for forming a gate electrode of PMOS changes into a P-type ($P^+$) polysilicon layer 44B due to the impurity ion implantation processes.

Referring to FIG. 4C, a post implantation anneal (PIA) process is performed for impurity activation after the impurity ion implantation processes are performed. For instance, the PIA process is performed at a temperature ranging from approximately 600° C. to approximately 1,000° C. for approximately 10 seconds to approximately 60 seconds.

The seam 45 formed in the N-type polysilicon layers 44A and the P-type polysilicon layer 44B may not grow or move when the PIA process is performed. This result is obtained because the N-type polysilicon layers 44A and the P-type polysilicon layer 44B are initially formed in a columnar structure.

Unlike an amorphous silicon layer, grain size changes are less likely to occur in a columnar polysilicon layer even during a PIA process. Thus, the initial crystal state is maintained and a seam may not grow or move.

When an amorphous silicon layer changes into a polysilicon layer after a PIA process, the grain size increases up to a level of approximately 800 Å. However, a columnar polysilicon layer has a grain size ranging from approximately 200 Å to approximately 300 Å even after a PIA process is performed.

The grain size of the columnar polysilicon is much smaller than that of the amorphous silicon layer. The grain boundary of the columnar polysilicon layer is further increased more than that of the amorphous silicon layer after the PIA process is performed.

Because there is virtually no grain size change in the columnar polysilicon layer, using the columnar polysilicon layer may obtain an increased grain boundary which accelerates impurity diffusion. Thus, an additional benefit may be obtained where a polysilicon depletion event is reduced on an interface between an insulation layer and the polysilicon layer. Accordingly, an activation current of the semiconductor device may increase. Due to such a characteristic, an amount of a PPG impurity dose to be additionally implanted may be reduced when skipping a process for forming an NPG.

When a PIA process is performed on an amorphous silicon layer, the grain size usually increases or a grain boundary generally decreases, causing a polysilicon depletion event where impurities diffusing onto an interface between the polysilicon layer and an insulation layer decrease.

Figure 4D:
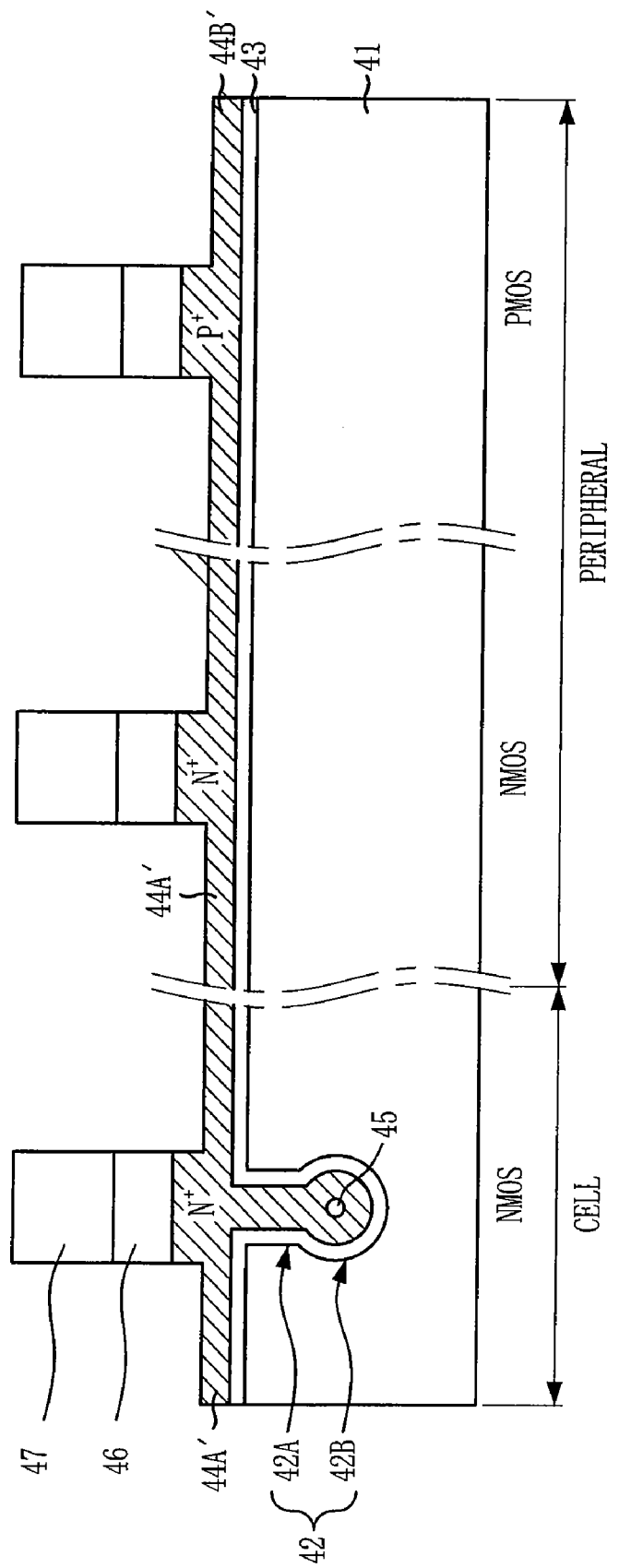

Referring to FIG. 4D, metal-based electrode layers 46 and hard masks 47 are formed over patterned N-type polysilicon layers 44A' and a patterned P-type polysilicon layer 44B'. In more detail, a metal-based layer is formed over the N-type polysilicon layers 44A and the P-type polysilicon layer 44B. The metal-based layer may include a tungsten nitride layer and a tungsten layer. The tungsten nitride layer functions as a diffusion barrier layer.

A hard mask layer is formed over the metal-based layer. The hard mask layer includes a nitride-based layer. For instance, the hard mask layer may include a silicon nitride layer.

A first gate etch is performed. The first gate etch includes etching the hard mask layer and the metal-based layer and etching a portion of the N-type polysilicon layers 44A and the P-type polysilicon layer 44B. Thus, the hard masks 47, the metal-based electrode layers 46, the patterned N-type polysilicon layers 44A' and the patterned P-type polysilicon layer 44B' are formed.

Figure 4E:
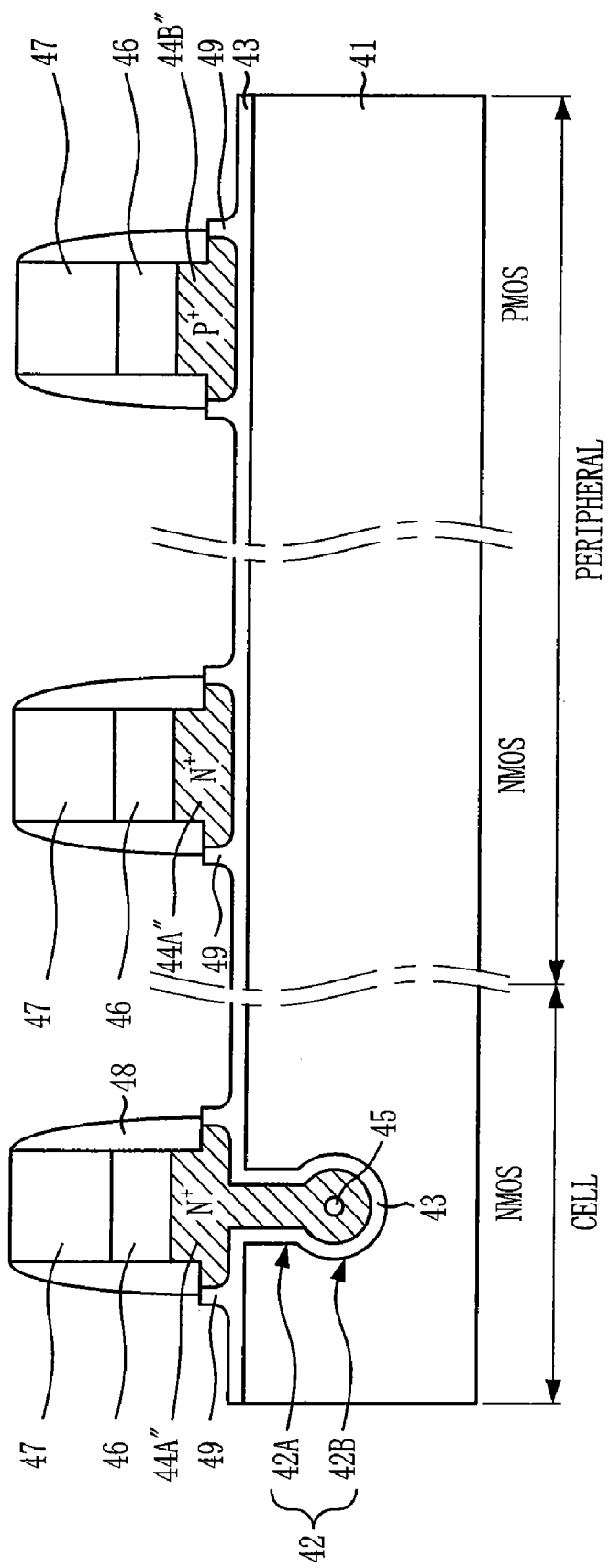

Referring to FIG. 4E, a capping layer is formed over the resultant structure and an etch-back process is performed. The patterned N-type polysilicon layers 44A' and the patterned P-type polysilicon layer 44B' are etched to form gate stacks. Reference numerals 44A" and 44B" represent remaining N-type polysilicon layers 44A" and a remaining P-type polysilicon layer 44B".

Portions of the capping layer remain on upper portions of the remaining N-type polysilicon layers 44A" and the remaining P-type polysilicon layer 44B" and on sidewalls of the metal-based electrode layers 46 and the hard masks 47. Reference numeral 48 represents remaining capping layers.

A selective oxidation process is performed as a subsequent process to form oxide-based layers 49. The selective oxidation process is performed in ambient hydrogen. Thus, exposed sidewalls of the remaining N-type polysilicon layers 44A" and the remaining P-type polysilicon layer 44B" and the surface of the substrate 41 are selectively oxidized. The sidewalls of the metal-based electrode layers 46 are protected from oxidation by the remaining capping layers 48.

The selective oxidation process is performed to form bird's beaks at the bottom corners of the gate stacks. The bird's beaks reduce electric field concentration at the corners of the gate stacks.

Figure 5:
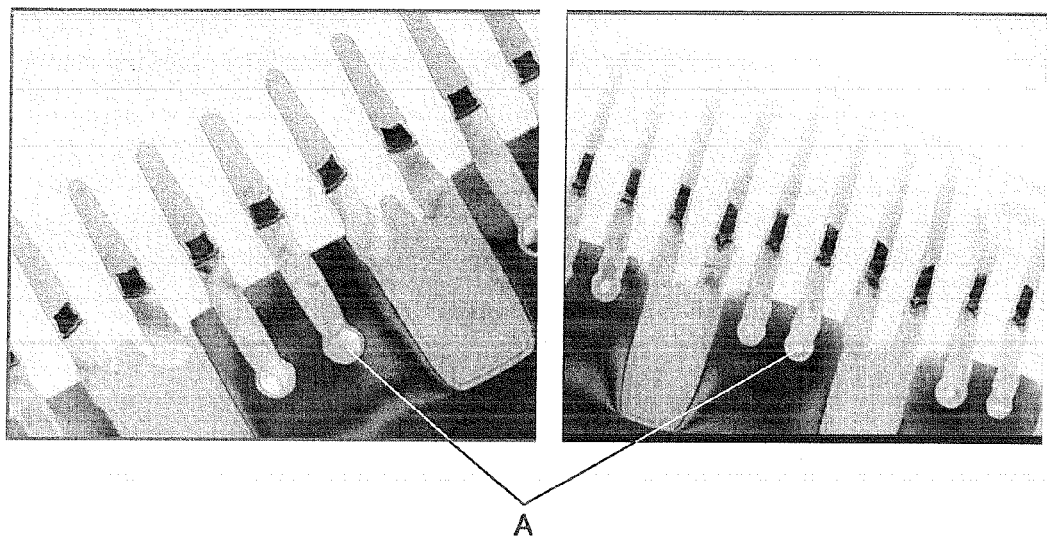
FIG. 5 illustrates micrographic views comparing seam movement between a typical method and embodiments of the present invention.

FIG. 5 illustrates micrographic views comparing seam movement between a typical method and embodiments of the present invention. Seams are represented by reference denotation 'A'. Seams in accordance with the conventional method move toward an insulation layer, whereas seams in accordance with embodiments of the present invention generally do not move and are smaller in size than those in accordance with the conventional method.

Figure 6:
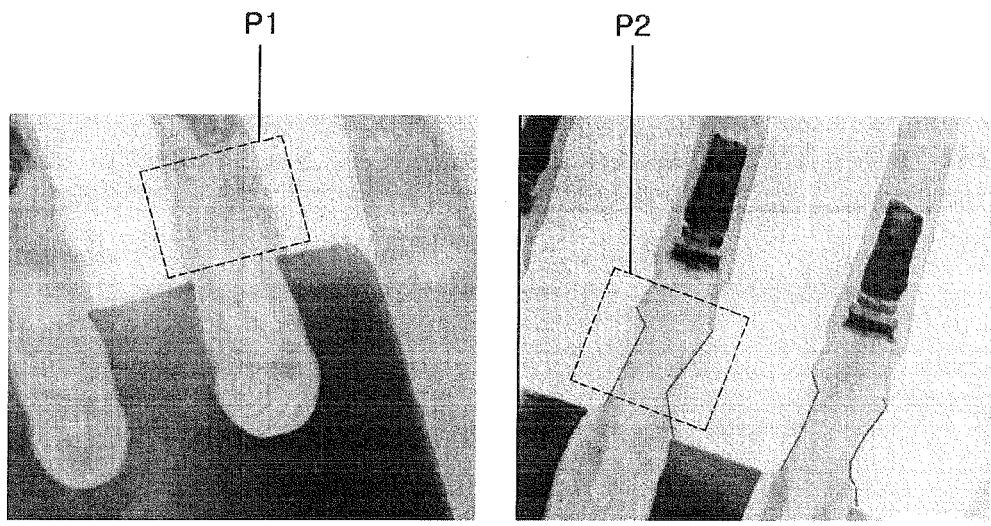
FIG. 6 illustrates micrographic views comparing etch profiles of gates between a typical method and embodiments of the present invention.

FIG. 6 illustrates micrographic views comparing etch profiles of gates between a typical method and embodiments of the present invention. An etch profile of gates according to the conventional method, represented by reference denotation 'P2', is formed non-uniformly, whereas an etch profile of gates according to embodiments of the present invention, that is, a profile of a polysilicon layer represented by reference denotation 'P1', is uniformly formed over the entire wafer.

The etch profile of the gates according to embodiments of the present invention is formed vertically, whereas sidewalls of the gates according to the conventional method are severely damaged. The uniform etch profile of the gates according to embodiments of the present invention may be obtained because a polysilicon layer having a columnar structure is used.

Although the above embodiments describe channels as bulb type recess regions, a columnar polysilicon layer can be applied as a gate electrode when fabricating a semiconductor device including multi-plane channels such as recess channels, saddle type channels, fin type channels, and saddle fin type channels.

While the present invention has been described with respect to specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming a bulb type recess in a substrate, wherein the bulb type recess comprises an upper portion and a lower portion, the lower portion being wider than the upper portion;
   forming an insulation layer over the substrate including a surface of the bulb type recess;
   depositing a columnar polysilicon layer over the insulation layer, wherein the columnar polysilicon layer fills the bulb type recess, the columnar polysilicon layer being deposited at a temperature ranging from approximately 650° C. to approximately 800° C. and predominantly comprised of columnar-shaped grains having an initial grain size and crystal structure; and
   performing a thermal treatment process, wherein the initial grain sizes and crystal structure of the columnar-shaped grains are substantially maintained at a constant after the thermal treatment process is performed such that a seam formed in the columnar polysilicon layer in the lower portion of the bulb type recess does not move during the thermal treatment process.

2. A method for fabricating a semiconductor device, the method comprising:
   forming a bulb type recess in a cell region of a substrate, wherein the substrate includes the cell region in which an N-channel metal-oxide semiconductor (NMOS) is to be formed and a peripheral region in which an NMOS and a P-channel metal-oxide semiconductor (PMOS) are to be formed at substantially the same time, the bulb type recess comprising an upper portion and lower portion that is wider than the upper portion;
   forming an insulation layer over the substrate structure including a surface of the bulb type recess;
   depositing a columnar polysilicon layer over the insulation layer, wherein the columnar polysilicon layer fills the bulb type recess, the columnar polysilicon layer being deposited at a temperature ranging from approximately 650° C. to approximately 800° C. and predominantly comprised of columnar-shaped grains having an initial grain size and crystal structure;
   implanting N-type impurities in portions of the columnar polysilicon layer where the NMOS is to be formed;
   implanting P-type impurities in a portion of the columnar polysilicon layer where the PMOS is to be formed; and
   performing a thermal treatment process, wherein the initial grain sizes and crystal structure of the columnar-shaped grains are substantially maintained at a constant after the thermal treatment process is performed such that a seam formed in the columnar polysilicon layer in the lower portion of the bulb type recess does not move during the thermal treatment process.

3. The method of claim 1, wherein the columnar polysilicon layer is deposited using a chemical vapor deposition method.

4. The method of claim 1, wherein depositing the columnar polysilicon layer comprises performing a single step formation process.

5. The method of claim 1, wherein the columnar polysilicon layer is implanted with impurities.

6. The method of claim 1, wherein the substrate comprises a cell region and a peripheral region, and wherein the bulb type recess is formed in the cell region.

7. The method of claim 1, wherein the substrate comprises an N-channel metal-oxide semiconductor (NMOS) region in which an NMOS is to be formed and a P-channel metal-oxide semiconductor (PMOS) region in which a PMOS is to be formed, and wherein the bulb type recess is formed in the NMOS region.

8. The method of claim 1, further comprising, after performing the thermal treatment process:
   forming a metal-based electrode and a hard mask layer over the columnar polysilicon layer;
   performing a first etch on the substrate structure such that the hard mask layer is etched up to a portion of the columnar polysilicon layer, thereby forming a first resultant structure;
   forming a capping layer over the first resultant structure;
   performing an etch-back process on the capping layer;
   performing a second etch on a remaining columnar polysilicon layer; and
   performing a selective oxidation on a residual columnar polysilicon layer.

9. The method of claim 1, wherein performing the thermal treatment process comprises performing a rapid thermal treatment process at a temperature ranging from approximately 600° C. to approximately 1,000° C.

10. The method of claim 3, wherein the chemical vapor deposition method is performed in a single wafer type chamber or a furnace.

11. The method of claim 5, wherein the impurities comprise one of phosphorus (P) and boron (B).

12. The method of claim 2, wherein the columnar polysilicon layer is deposited using a chemical vapor deposition method.

13. The method of claim 2, wherein depositing the columnar polysilicon layer comprises performing a single step formation process.

14. The method of claim 2, wherein performing the thermal treatment process comprises performing a rapid thermal treatment process at a temperature ranging from approximately 600° C. to approximately 1,000° C.

15. The method of claim 2, further comprising, after performing the thermal treatment process:
- forming a metal-based electrode and a hard mask layer over the columnar polysilicon layer;
- performing a first etch on the substrate structure such that the hard mask layer is etched up to a portion of the columnar polysilicon layer, thereby forming a first resultant structure;
- forming a capping layer over the first resultant structure;
- performing an etch-back process on the capping layer;
- performing a second etch on a remaining Columnar polysilicon layer; and
- performing a selective oxidation on a residual columnar polysilicon layer.

16. The method of claim 12, wherein the chemical vapor deposition method is performed in a single wafer type chamber or a furnace.

17. The method of claim 13, wherein depositing the columnar polysilicon layer comprises implanting impurities in-situ.

18. The method of claim 17, wherein the impurities comprise phosphorus (P).

* * * * *